(12) United States Patent
Qian

(10) Patent No.: US 6,512,352 B2
(45) Date of Patent: Jan. 28, 2003

(54) ACTIVE CLAMP STEP-DOWN CONVERTER WITH POWER SWITCH VOLTAGE CLAMPING FUNCTION

(75) Inventor: Jinrong Qian, Plano, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 09/876,632

(22) Filed: Jun. 7, 2001

(65) Prior Publication Data

US 2002/0185993 A1 Dec. 12, 2002

(51) Int. Cl.[7] .............................. H02M 3/335; G05F 1/56
(52) U.S. Cl. ..................... 323/282; 323/222; 363/21.12
(58) Field of Search .................. 323/222, 282, 323/901, 902, 908; 363/21.04, 21.08, 21.12, 21.16

(56) References Cited

U.S. PATENT DOCUMENTS

| | | | |
|---|---|---|---|
| 5,471,376 A | | 11/1995 | Tsai et al. ..................... 363/20 |
| 5,477,131 A | * | 12/1995 | Gegner ........................ 323/222 |
| 5,594,635 A | * | 1/1997 | Gegner ........................ 363/124 |
| 5,636,107 A | | 6/1997 | Lu et al. ........................ 363/20 |
| 5,736,842 A | * | 4/1998 | Jovanovic .................... 323/222 |
| 5,815,386 A | * | 9/1998 | Gordon .......................... 363/50 |
| 5,886,508 A | * | 3/1999 | Jutras .......................... 323/267 |
| 5,978,238 A | | 11/1999 | Liu .............................. 363/56 |
| 6,005,782 A | | 12/1999 | Jain et al. ..................... 363/21 |
| 6,061,254 A | | 9/2000 | Takegami ..................... 363/21 |
| 6,259,235 B1 | * | 7/2001 | Fraidlin et al. ............. 323/222 |

* cited by examiner

Primary Examiner—Bao Q. Vu

(57) ABSTRACT

A circuit for clamping a voltage across a switching element to a value equal to or less than the sum of the input voltage plus the voltage across a clamping capacitor is provided. The circuit achieves voltage clamping in a circuit configuration in which an active clamp circuit includes a switch and a clamping capacitor connected in parallel with a first winding of a coupled winding. The active clamp prevents the occurrence of voltage spikes across a first switching element. The clamping capacitor serves a second function in that it recovers energy stored in the first winding of the coupled winding.

19 Claims, 4 Drawing Sheets

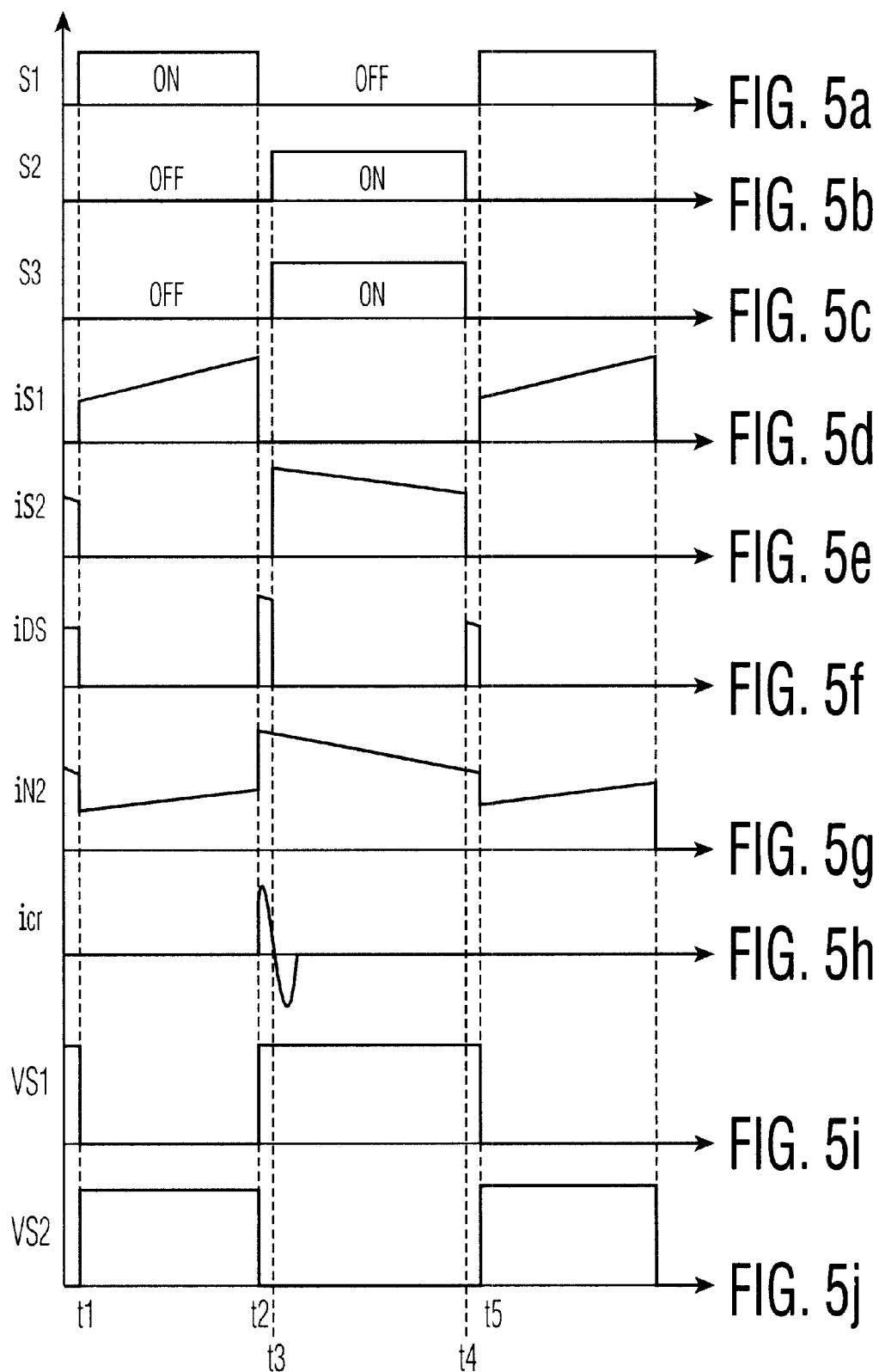

US 6,512,352 B2

ACTIVE CLAMP STEP-DOWN CONVERTER WITH POWER SWITCH VOLTAGE CLAMPING FUNCTION

BACKGROUND OF THE INVENTION

1. Technical Field of the Invention

The present invention relates to the field of switching power supplies, and in particular, to a switching voltage regulator module.

2. Description of the Related Art

Advances in integrated circuit (IC) technology often relate to the ever decreasing operating voltages required to operate such circuits. A lower operating voltage may translate into lower costs due to decreases in circuit size and power consumption. Present demands for faster and more efficient data processing have prompted a significant development effort in the area of low-voltage integrated circuits. Currently, low-voltage integrated circuits operating in the three-volt range (e.g., 3.3 V ICs) are highly desirable. The three-volt ICs are gradually replacing the standard five-volt ICs due to their higher speed and higher integration densities.

Moreover, the three-volt ICs consume less power than the traditional five-volt ICs. Thus, in battery operated devices, such as portable telephones and lap-top computers, low-voltage integrated circuits allows the devices to operate proportionally longer than devices requiring higher voltage for operation.

However, the 3.3 V IC represents only a transition to ICs with even lower operating voltages that will not only further improve speed and reduce power consumption, but will also allow direct, single-cell battery consumption. It is expected that the next generation of data processing ICs will be operable at voltages in the 1–3 V range. At the same time, since more devices are integrated on a single processor chip and the processors operate at higher frequencies, microprocessors require aggressive power management. Compared with current processors, which require a current draw around 13 amps, future generation processors will require a current draw in the range of 30–50 amps. The load range may reach 1:100.

Further, as the speed of the ICs increase, they are becoming more dynamic loads to their power supplies. Next generation microprocessors are expected to exhibit current slew rates of 5 A/ns. Moreover, the output voltage regulation becomes much tighter (e.g., from 5% to 2%). Voltage regulator modules (VRMs) which feed the microprocessors have to have high efficiency, fast transient response and high power density. These requirements pose serious design challenges.

FIG. 1 is a schematic block diagram of a prior art synchronized buck converter 100. The circuit 100 is typically used as a VRM to meet the requirements of high efficiency, fast transient response and high power density. In operation, switches S1 and S2 turn on and off in complementary fashion. The voltage gain of the buck converter circuit 100 can be described by:

$$D=V_o/V_{in} \quad (1)$$

where D is the duty ratio of switch S1.

As is well known in the art, the buck converter has a high efficiency and good transient response at around a duty cycle of 0.5. For a 5V input voltage and a 2V output, the duty cycle is 0.4, which is an acceptable duty cycle ratio for achieving high efficiency.

Since future VRMs will be required to provide more power to the microprocessors, the power switch must be able to deal with higher currents, which decreases efficiency. However, in accordance with the power equation, the increased power required by future microprocessors may be achieved by raising the input voltage instead, which allows the input current to be decreased, thereby reducing conduction losses. As such, it is preferable that VRMs have a 12V or higher input voltage. For example, the input voltage can be as high as 19V for notebook computers. According to equation (1), the duty cycle for a conventional synchronized buck converter is as small as 0.1 with a 12V input and a 1.2V output. A drawback of a duty cycle on the order of 0.1 is that the circuit exhibits poor performance in terms of efficiency, voltage regulation and transient response.

A schematic of another conventional buck converter circuit 200 is illustrated in FIG. 2. This buck converter circuit 200 is well known in the art as a tapped inductor synchronized buck converter. The tapped inductor synchronized buck converter circuit 200 operates from an unregulated supply voltage $V_{IN}$ and provides a regulated DC output voltage $V_O$ at terminal 111 (e.g., 2 volts) for driving load $R_L$ which, for example, may be a microprocessor, portable or laptop computer or other battery-operated system. Circuit 200 includes power switches S1 and S2, such as a power metal oxide semiconductor field effect transistors (MOSFETS), acting in complementary fashion. Circuit 200 further includes leakage inductor $L_k$, coupled windings N1 and N2, and filter capacitor Co.

As is made clear below, those of ordinary skill will recognize that inductor $L_k$ is not a separate component, but represents the leakage inductance of winding N1. Windinns N1 and N2 are coupled magnetically, and connected electrically at the tap or common junction to which the second switch is connected.

FIG. 3 illustrates various waveforms associated with circuit 200. The operation of circuit 200 will be described with reference to certain of the waveforms of FIG. 3. When switch S1 turns on during the time interval t1 to t2 (see FIG. 3a), a voltage difference, $V_{in}-V_o$ is applied to the coupled inductor windings N1 and N2. The switching current in switch S1 linearly increases (See FIG. 3d) and the voltage across switch S2 is the input voltage (see FIG. 3f). The circuit delivers power to the output. At time t2, switch S1 turns off and switch S2 turns on (see FIG. 3b). The energy stored in winding N1 is transferred to winding N2, and the winding current $i_{s2}$ flows through S2 and linearly decreases (see FIG. 3c). The voltage gain of circuit 200 can be written as:

$$V_o/V_{in}=D/[1+(N1/N2)*(1-D)] \quad (2)$$

where D is the duty ratio of switch S1. From equation (2) it can be seen that a duty cycle on the order of 0.5 can be realized to achieve high efficiency by properly choosing the turns ratio of the coupled inductors.

One disadvantage of circuit 200 is that a high voltage spike occurs across switch S1 when S1 turns off (e.g., at time t2, See FIG. 3e) because the leakage energy of winding N1 cannot be transferred to winding N2. The leakage energy in $L_k$ charges the output capacitance (not shown) of S1 through conducting switch S2 which causes a high voltage stress across S1. As a result, a high voltage rated MOSFET switch must be used in the circuit 200 which significantly increases the power loss and reduces the efficiency.

It would be desirable to provide a circuit configuration which avoids the necessity of using a high voltage rated MOSFET switch and which recycles the leakage energy of the coupled inductor to further improve circuit efficiency.

SUMMARY OF THE INVENTION

It is, therefore, a primary object of the present invention to provide a circuit so that a low-voltage rated power switch can be used to improve circuit efficiency.

It is another object of the present invention to provide a circuit which recycles the leakage energy of the coupled inductor to further improve circuit efficiency.

It is yet another object of the present invention to provide a circuit which uses as few components as necessary.

In accordance with an embodiment of the present invention, there is provided an active clamp step-down converter circuit with a power switch voltage clamping function including a first switch connected in series with an unregulated DC input source, a second switch coupled at one junction at a midpoint of a coupled winding including a first winding and a second winding, a leakage inductance $L_k$ associated with one winding of the coupled winding, a shottky diode connected in parallel with the second switch and an active clamp circuit including a clamping capacitor and a third switch, connected in series. The clamp circuit is connected in parallel with the leakage inductance and the first winding. The converter circuit further includes a filter capacitor connected to one terminal of the second winding and connected in parallel with a load.

The clamping capacitor clamps the voltage across the first switch during the period in which the first switch is off. The clamped voltage across the first switch is the sum of the input voltage and clamping capacitor voltage.

A main advantage provided by the circuit of the present invention is the prevention or substantial elimination of voltage spikes which would otherwise occur at each switch transition to the OFF state. Voltage spikes are eliminated by incorporating the active clamp circuit connected in parallel with the first winding.

A further advantage of the circuit of the present invention is that by recovering the leakage energy in each switching cycle, as opposed to dissipating it in accordance with prior art approaches, the overall circuit efficiency (i.e., power out/power in) is enhanced. An additional advantage of capturing the leakage current is that the voltage rating of the first switch is significantly reduced thereby reducing its cost.

A still further advantage of the circuit of the present invention is that the circuit is optimized to operate with a duty cycle of around 0.5 which improves the dynamic response and system efficiency. By operating with a nominal duty cycle of around 0.5, the circuit is responsive to changing load conditions. That is, when the load changes from a nominal to a heavy load, the duty cycle must be raised from 0.5 to a value close to 1 to insure that the output voltage variation remains within specification. Similarly, when the load changes from a nominal load to a light load, the duty cycle must be lowered from 0.5 to a value close to zero to insure that the output voltage variation remains within specification. The required changes in the duty cycle are most easily effected with a circuit that operates according to the present invention.

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, where:

FIGS. 5a–5j illustrate representative waveforms of the circuit of FIG. 4.

DETAILED DESCRIPTION OF THE PREFERRED EMBODIMENTS

An active clamp step-down converter for a voltage regulator module (VRM) is provided which eliminates or significantly reduces voltage spikes which occur across the circuit switching element during turn-off at each switching cycle. Additionally, the converter circuit of the present invention is more power efficient than converter circuits of the prior art in that inductor leakage energy is recovered during intervals between conduction by the switching element.

Figure 1:
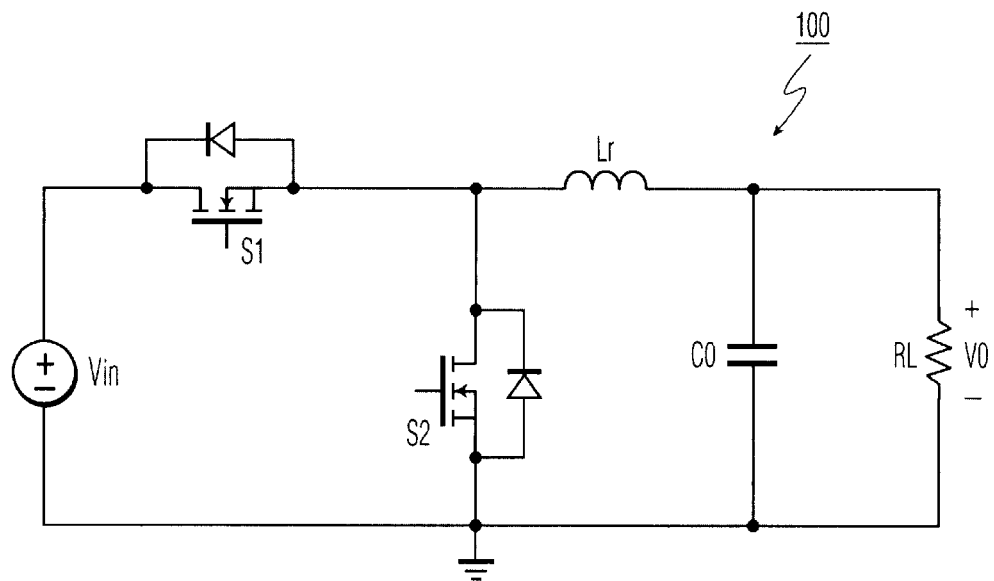
FIG. 1 is a circuit diagram illustrating a synchronized buck converter circuit for use as a voltage regulating module in accordance with the prior art.
Figure 2:
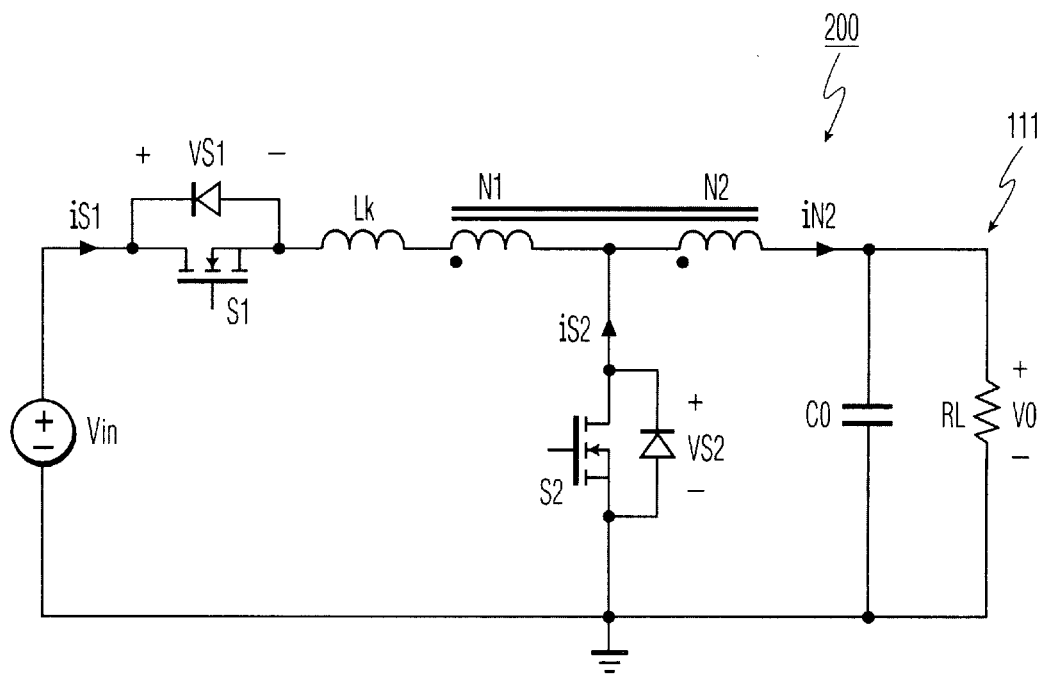
FIG. 2 is a circuit diagram illustrating a tapped inductor synchronized buck converter in accordance with the prior art.
Figures 3A, 3B, 3C, 3D, 3E, 3F:
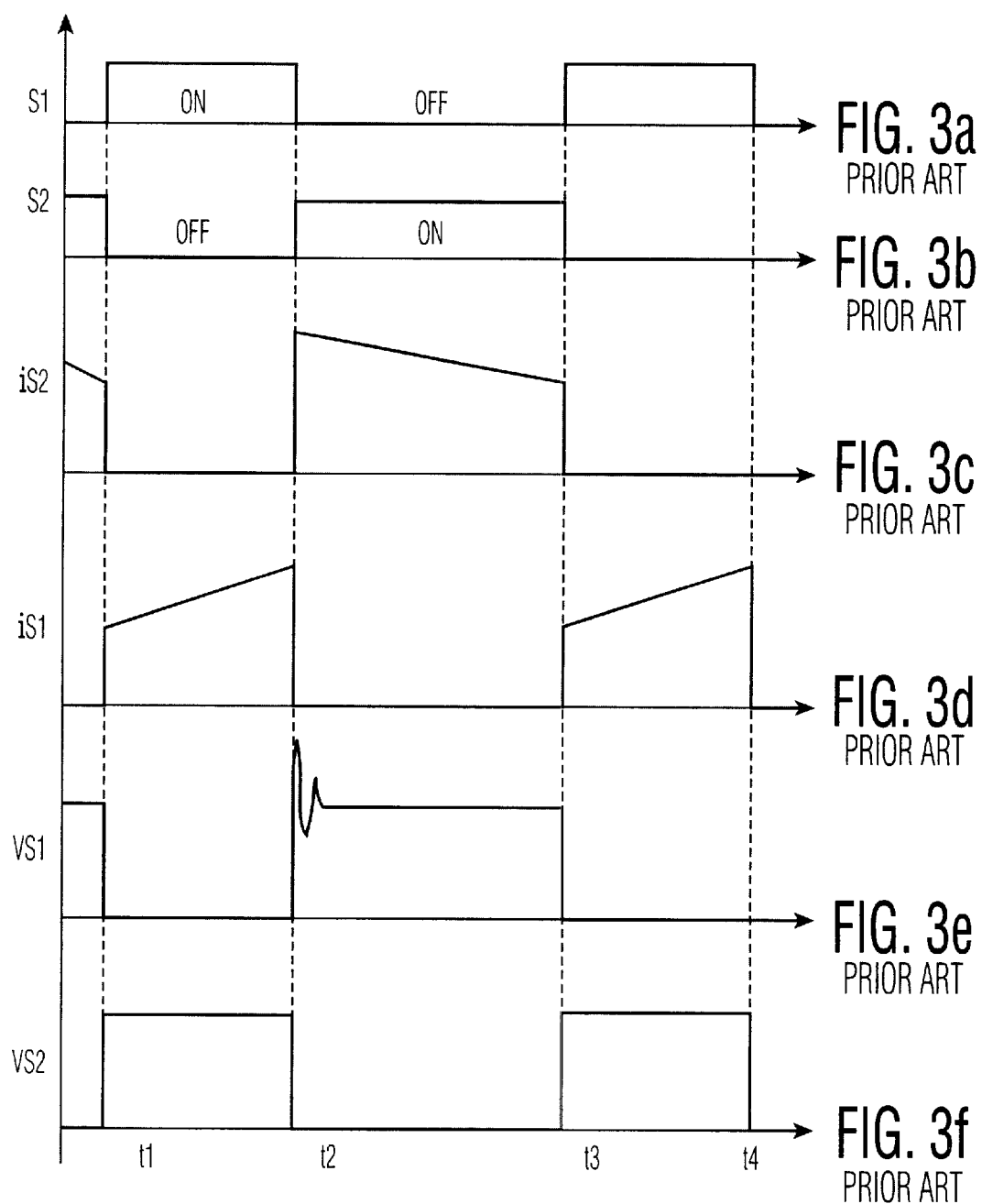
FIGS. 3a–3f illustrate representative waveforms of the circuit of FIG. 2.
Figure 4:
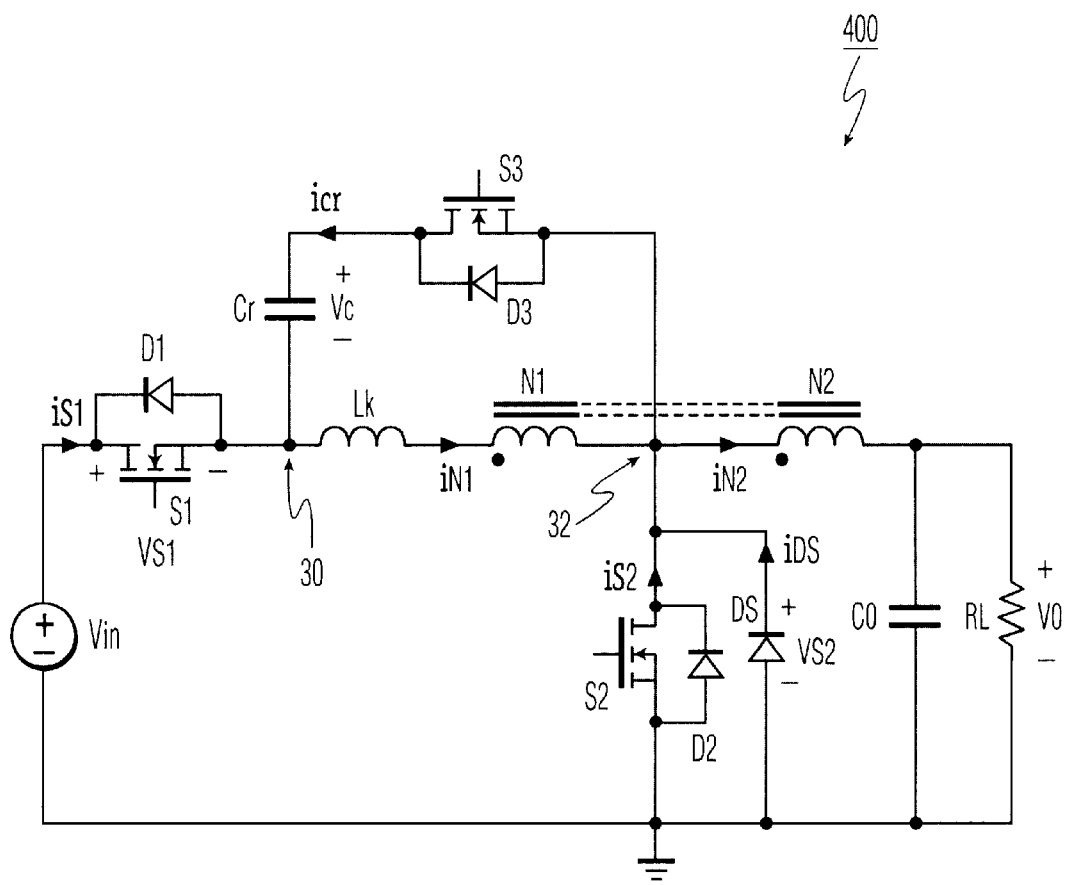
FIG. 4 is a circuit diagram illustrating an active clamp step-down converter circuit with a power switch voltage clamping function in accordance with the present invention.

An embodiment of the DC-DC converter circuit 400 of the present invention is shown schematically in FIG. 4. The converter circuit 400 includes a first power switch S1 connected across an unregulated DC input source, $V_{in}$. One side of power switch S1 is connected to a leakage inductance $L_k$ associated with winding N1. Leakage inductor $L_k$ is connected at junction 30 to clamping capacitor $C_r$.

The circuit branch which includes clamping capacitor Cr in series with switch S3 is referred to as an active clamp circuit for clamping the voltage across switch S1 during transitions of the switch S1 from the ON to the OFF state. One terminal of coupled windings N1 and N2, switch S3, switch S2 and diode DS are connected at a common junction 32.

Thus one end of the clamping circuit is connected directly and bidirectionally to the common junction. Likewise, the other current terminal of switch S2 is connected to a common bus.

Power switches S1, S2 and S3 may be a power MOSFET or other well-known semiconductor switches as would be appreciated by those skilled in the art. Switch S1 includes internal body diode D1. Similarly, switches S2 and S3 include internal body diodes D2 and D3, respectively. The converter circuit 400 further includes filter capacitor $C_o$ connected in parallel with the load $R_L$.

The operation of the converter circuit 400 will be described with reference to FIGS. 5a–5j which illustrate typical switching waveforms associated with the converter circuit 400.

At a time prior to time t1, switch S1 is OFF. From a time t1 to a time t2, switch S1 is turned ON (see FIG. 5a) and switches S2 and S3 are turned off (see FIGS. 5b and 5c). The voltage difference between the input voltage $V_{in}$ and the output voltage $V_o$ is applied to the coupled inductor windings N1 and N2. The switching current $i_{s1}$ and winding currents $i_{n1}$ and $i_{n2}$ increase linearly as shown in FIGS. 5d and 5e, respectively. The voltage across switch S2 is the input voltage $V_{in}$ (see FIG. 5j). The input voltage delivers power to the output until switch S1 turns off at time t2.

At a time equal to t2, switch S1 is turned OFF. The energy stored in winding N1 from the switching current $i_{s1}$ from time t1 to t2 is transferred to winding N2. The current $i_{n2}$ flows through schottky diode DS (see FIG. 5f). The leakage energy in inductor $L_k$ charges the clamping capacitor $C_r$ through the body diode D3 of switch S3.

At a time between t2 and t3, switches S1, S2 and S3 are all OFF and a voltage $V_{s1}$ is defined as $$V_{s1}=V_{in}+V_c-VD2+VD3 \qquad (3)$$

The last two terms are negligible (e.g., on the order of 0.7). Upon eliminating the last two terms it is therefore shown that voltage $v_{s1}$ (see FIG. 5I) is clamped to a value equal to the sum of the input voltage $V_{in}$ and the voltage across clamping capacitor $C_r$, $V_c$:

$$V_{s1}=V_{in}+V_c \quad (4)$$

At a time between t3 and t4, switch S2 and switch S3 turn on at zero voltage switching at time t3 because the anti-parallel diodes of both switches are conducting prior to time t3. As such, there is no turn-on switching loss for switches S2 and S3. The charged energy in capacitor $C_r$ discharges through the path defined by switch S3 and winding N1. As a consequence of the coupling of N1 and N2, a portion of the discharged energy, which is the leakage energy in N1, is delivered to the load $R_L$.

It is therefore shown that the maximum voltage stress across switch S1 is the sum of the input voltage Vin and clamping capacitor voltage Vc. Voltage Vc may be written as:

$$V_c=(N1/N2)*v_o \quad (5)$$

Rewriting equation (1) and substituting for the value of Vc as written in equation (5) yields $$V_{s1}=V_{in}+(N1/N2)*v_o \quad (6)$$

Equation (6) illustrates that the voltage stress across switch S1, $V_{s1}$ is fully clamped.

While the invention has been described with respect to specific embodiments by way of illustration, many modifications and changes will be apparent to those skilled in the art. It is therefore, to be understood that the appended claims are intended to cover all such modifications and changes as fall within the true spirit and scope of the invention.

I claim:

1. A converter circuit comprising:
   a first switching element S1 connected in series with a DC input source, whereby all current from the source must flow through the first switching element;
   a first winding N1 and a second winding N2; and
   an active clamp circuit coupled directly and bidirectionally to the first switching element S1, the first winding N1 and the second winding N2 for at least reducing voltage spikes across said first switching element S1.

2. The converter circuit of claim 1, further comprising a second switching element S2 coupled to the first and second windings.

3. The converter circuit of claim 2, further comprising a diode DS connected in parallel with the second switching element S2.

4. The converter circuit of claim 1, wherein said converter circuit further includes a filter capacitor coupled in parallel to a load.

5. The converter circuit of claim 1, wherein said converter is a DC-DC converter.

6. A method of clamping a voltage across a switching element in a converter circuit, said method comprising the steps of:
   providing a first switching element S1 connected in series with a DC input source, whereby all current from the source must flow through the first switching element;
   providing a first winding N1 and a second winding N2; and
   clamping said voltage by directly coupling an active clamp circuit to the first switching element S1, the first winding N1 and the second winding N2 for reducing voltage spikes across said first switching element S1.

7. The method of claim 6, further comprising the step of providing a second switching element S2 coupled to the first and second windings.

8. The method of claim 7, further comprising the step of providing a diode DS connected in parallel with the second switching element S2.

9. The method of claim 6, further comprising the steps of:
   providing a clamping capacitor $C_r$ adapted to recover leakage energy from said first winding N1; and
   providing a third switching element S3 connected in series with said clamping capacitor $C_r$;
   wherein said clamping capacitor and said third switching element S3 form said clamping circuit.

10. The method of claim 6, wherein said clamping step is performed at a time when said switching element transitions from an ON state to an OFF state.

11. The method of claim 9, wherein said clamping capacitor recovers energy during an OFF state of said switching element.

12. The method of claim 6, wherein first winding N1 has an equivalent leakage inductance $L_k$, further comprising the step of recovering leakage energy in inductance $L_k$ in each switching cycle.

13. The method of claim 12, wherein the leakage energy in $L_k$ is recovered by charging the clamping capacitor $C_r$ through the body diode D3 of switching element S3.

14. A converter circuit comprising:
   a first switching element S1 connected in series with a DC input source, whereby all current from the source must flow through the first switching element;
   a first winding N1 and a second winding N2 each having a respective end connected to a node therebetween, and magnetically coupled to each other, winding N1 having an other end connected to the first switching element; and
   an active clamp circuit coupled in parallel with winding N1 to the first switching element S1, and to said node for at least reducing voltage spikes across said first switching element S1.

15. The converter circuit of claim 14, wherein said active clamp circuit comprises a clamping switch S3 in series with a clamping capacitor $C_r$, said capacitor $C_r$ being arranged to recover leakage energy from said first winding N1.

16. The converter circuit of claim 14, wherein:
   said active clamp circuit comprises a clamping switch S3 in series with a clamping capacitor $C_r$, and
   the converter circuit further comprises a second switching element S2 connected between said node and a common bus.

17. The converter circuit of claim 16, further comprising a diode DS connected in parallel with the second switching element S2.

18. The method of claim 6, further comprising the steps of:
   magnetically coupling the windings to each other,
   connecting one end of each of said windings to a node therebetween,
   connecting the other end of winding N1 to first switching element S1, and
   connecting the clamping circuit in parallel with winding N1.

19. The method of claim 18, further comprising the step of connecting a second switching element S2 between said node and a common bus.

* * * * *